(12) United States Patent
Rowe et al.

(10) Patent No.: US 10,852,321 B2
(45) Date of Patent: Dec. 1, 2020

(54) TEST HANDLER HEAD HAVING REVERSE FUNNEL DESIGN

(71) Applicant: Delta Design, Inc., Poway, CA (US)

(72) Inventors: David Rowe, Poway, CA (US); Tyler Bettendorf, Poway, CA (US); Julius Mulle, Poway, CA (US); James Duffy, Poway, CA (US); Thanh Du, Poway, CA (US); Jay Gem Mandafe, Poway, CA (US)

(73) Assignee: DELTA DESIGN, INC., Poway, CA (US)

( * ) Notice: Subject to any disclaimer, the term of this patent is extended or adjusted under 35 U.S.C. 154(b) by 264 days.

(21) Appl. No.: 15/681,047

(22) Filed: Aug. 18, 2017

(65) Prior Publication Data

US 2018/0052188 A1  Feb. 22, 2018

Related U.S. Application Data

(60) Provisional application No. 62/377,170, filed on Aug. 19, 2016.

(51) Int. Cl.
*G01R 1/073* (2006.01)
*G01R 1/04* (2006.01)
*G01R 1/067* (2006.01)
*G01R 31/28* (2006.01)

(52) U.S. Cl.
CPC ....... *G01R 1/0466* (2013.01); *G01R 1/06722* (2013.01); *G01R 31/2891* (2013.01); *G01R 31/2893* (2013.01)

(58) Field of Classification Search
CPC .............. G01R 1/0466; G01R 1/06722; G01R 31/2891
USPC ....................................................... 324/750.2
See application file for complete search history.

(56) References Cited

U.S. PATENT DOCUMENTS

| | | |
|---|---|---|
| 3,761,808 A | 9/1973 | Ryan |
| 4,747,784 A | 5/1988 | Cedrone |
| 4,866,374 A | 9/1989 | Cedrone |
| 4,940,935 A | 7/1990 | Riley |
| 5,708,222 A | 1/1998 | Yonezawa et al. |
| 5,739,697 A | 4/1998 | Balyasny et al. |
| 6,075,279 A | 6/2000 | Andoh |
| 6,184,544 B1 | 2/2001 | Toda et al. |

(Continued)

FOREIGN PATENT DOCUMENTS

WO    WO-2016140505 A1 * 9/2016  ........... G01R 1/0466

*Primary Examiner* — Melissa J Koval
*Assistant Examiner* — Courtney G McDonnough
(74) *Attorney, Agent, or Firm* — Foley & Lardner LLP

(57) ABSTRACT

A test head for a semiconductor device handler includes a plunger; and a funnel insert attached to the plunger via a funnel insert spring, the funnel insert having a channel extending axially therethrough, and the funnel insert including a plurality of sloped inner walls that are sloped outwardly in a distal direction of the funnel insert and configured to contact upper edges of a semiconductor device to center the semiconductor device in the funnel insert. The plunger includes a projecting portion that extends through the channel of the funnel insert. When the spring is in an uncompressed state, a distal end of the funnel insert extends past a distal end of the projecting portion of the plunger.

7 Claims, 15 Drawing Sheets

(56) References Cited

U.S. PATENT DOCUMENTS

| | | | |
|---|---|---|---|
| 6,251,219 B1 * | 6/2001 | Chen | H01L 21/52 |
| | | | 156/299 |
| 6,297,653 B1 | 10/2001 | Hembree | |
| 6,364,386 B1 | 4/2002 | Quick et al. | |
| 6,369,594 B1 | 4/2002 | O'Keeffe | |
| 6,392,433 B2 | 5/2002 | Itasaka et al. | |
| 6,741,090 B2 | 5/2004 | Yamashita | |
| 7,453,259 B2 | 11/2008 | Hoppe | |
| 7,609,052 B2 | 10/2009 | Mizushima et al. | |
| 2001/0026152 A1 * | 10/2001 | Kang | G01R 31/2867 |
| | | | 324/750.2 |
| 2001/0033179 A1 | 10/2001 | Difrancesco | |
| 2004/0085060 A1 | 5/2004 | Matsumoto | |
| 2008/0156789 A1 * | 7/2008 | Devey | B23K 1/018 |
| | | | 219/444.1 |
| 2015/0241477 A1 * | 8/2015 | Ponghon | G01R 31/2891 |
| | | | 324/750.25 |

* cited by examiner

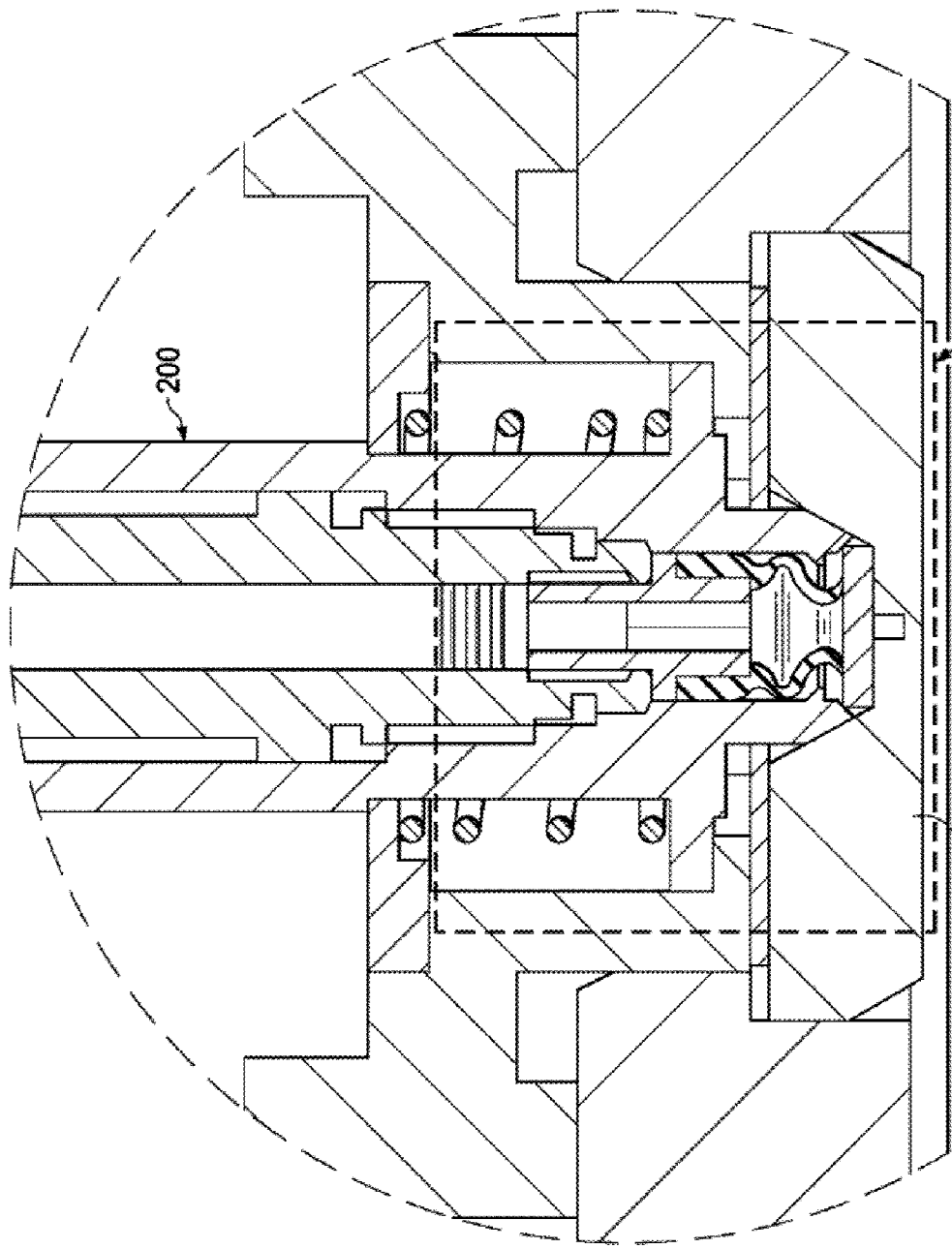

0.7mm Thick Device    1.5mm Thick Device

Shuttle floating pocket deflects to compensate for thickness change.

US 10,852,321 B2

TEST HANDLER HEAD HAVING REVERSE FUNNEL DESIGN

CROSS-REFERENCE

This application claims the benefit of U.S. Provisional Appl. No. 62/377,170, filed Aug. 19, 2016, the disclosure of which is herein incorporated by reference in its entirety.

BACKGROUND OF THE INVENTION

This invention relates to the field of test equipment for integrated circuit devices. More particularly, this invention relates a handler mechanism used for presenting an integrated circuit device, such as a Leadless Surface Mount (SMD) device, to a test socket for testing.

Handler mechanisms on current test systems must handle a wide range of integrated circuit device body tolerances (e.g., up to 0.2 mm), which can affect the contactor pin to device contact pad presentation, causing incorrect package alignment on the device alignment portion. The misalignment can cause electrical failures especially on continuity testing. Moreover, the electrical failures reduce productivity due to additional manual rescreens required to confirm or reject the continuity failures from the first test sequence.

Many current handler mechanisms utilize a plunger such as that shown in FIG. 1, having a fixed opening 101 with an internal vertical wall to align the device to be tested with contacts of the test socket.

Taking into consideration a package size tolerance of 0.2 mm range or +/−0.1 mm (which is only an example), implementing a fixed opening dimension on the plunger/alignment portion vertical wall of a nominal package tolerance of +0.1 mm can cause a problem of device movement in the opening 101 of the plunger especially if devices are on the lower side of the tolerance. Tightening the fixed opening dimension on the vertical plunger wall to target devices that are on lower side of the tolerance will induce stuck devices on the plunger, especially if device is on the high side of the tolerance. In other words, making the plunger cavity large enough to tolerate package on the high side of the tolerance can cause high continuity failures while reducing the plunger cavity size to tolerate the packages on the low side of the tolerance will reduce continuity failures but will generate more test problems by increasing jamming problems with the handler mechanism.

An obvious approach is to control the device body package tolerance. However, assembly yields suffer and cost increases due to increase scrappage of device not meeting the tighter tolerance.

As such, there has arisen a need for a device and method for providing better device pad to contactor pin presentation for a large package tolerance.

SUMMARY OF THE INVENTION

In one embodiment, a test head for a semiconductor device handler includes a plunger including: a funnel alignment portion including a plurality of sloped inner walls that are sloped outwardly in a distal direction of the plunger and configured to contact upper edges of a semiconductor device to center the semiconductor device in the plunger, wherein a channel extends through the plunger, including the funnel alignment portion; and a vacuum pad extending through the channel of the plunger and the funnel alignment portion, the vacuum pad being configured to contact an upper surface of the semiconductor device and supply a vacuum to hold the semiconductor device in the test head.

In another embodiment, a test head for a semiconductor device handler includes a plunger; and a funnel insert attached to the plunger via a funnel insert spring, the funnel insert having a channel extending axially therethrough, and the funnel insert including a plurality of sloped inner walls that are sloped outwardly in a distal direction of the funnel insert and configured to contact upper edges of a semiconductor device to center the semiconductor device in the funnel insert, wherein the plunger includes a projecting portion that extends through the channel of the funnel insert, and wherein, when the spring is in an uncompressed state, a distal end of the funnel insert extends past a distal end of the projecting portion of the plunger.

BRIEF DESCRIPTION OF THE DRAWINGS

Embodiments of the invention are described by referring to the attached drawings, in which:

FIG. 4 is a side view of an exemplary test head that includes a plunger, a device alignment portion, and associated hardware, according to one embodiment of this invention.

In the drawings, like reference numerals are sometimes used to designate like structural elements. It should also be appreciated that the depictions in the figures are diagrammatic and not to scale.

DETAILED DESCRIPTION

In the following description, for purposes of explanation and not limitation, details and descriptions are set forth in order to provide a thorough understanding of embodiments of the present invention. However, it will be apparent to those skilled in the art that the present invention may be practiced in other embodiments that depart from these details and descriptions.

Test Head with Plunger Having Integral Funnel Alignment Portion

Figure 1:
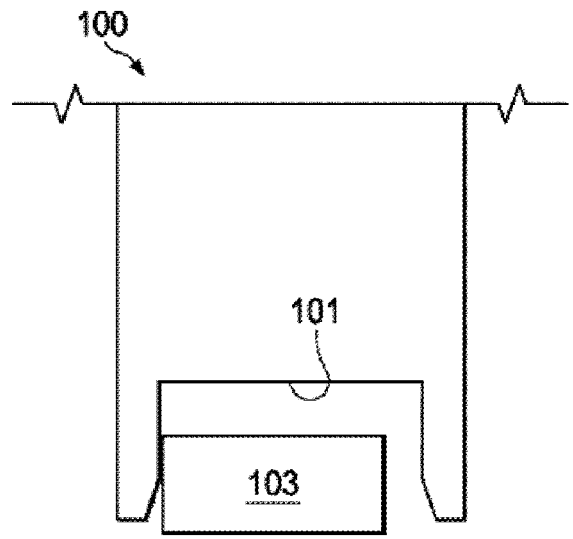
FIG. 1 is a sectional view of an exemplary plunger having a vertical wall alignment portion, with a surface mount device aligned therein.
Figure 2:
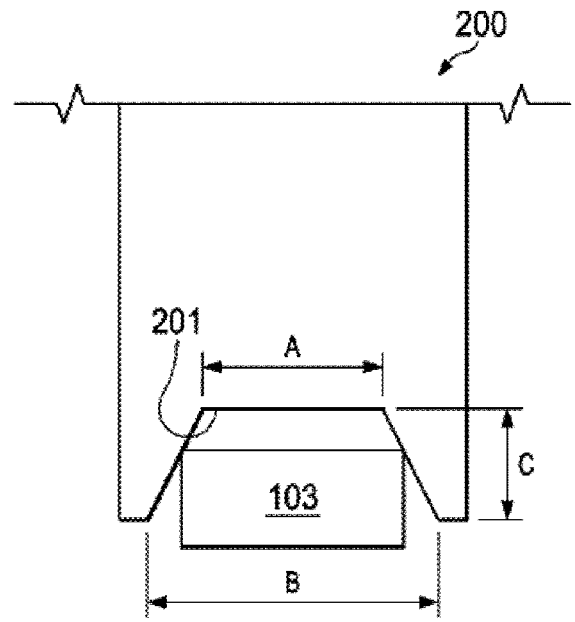
FIG. 2 is a sectional view of an exemplary plunger having a funnel alignment portion, with surface mount a device aligned therein, according to one embodiment of this invention.

According to embodiment, a test head of a handler includes a funnel alignment portion 201, as shown in FIG. 2, instead of the vertical alignment portion 101 shown in FIG. 1. The alignment portion 201 has sloped inner walls configured to center a device under test at a center of the plunger 200 (sometimes referred to as a "chuck"). Moreover, the funnel alignment portion tolerates devices with measurements within a larger package tolerance than the vertical wall alignment portion 101.

FIG. 1 shows an example of a plunger 100 having a vertical wall alignment portion 101 designed to the nominal size of the subject surface mount device 103. The figure shows a device 103 at the minimum tolerance. It can be easily recognized that the device 103 can slide sideways in the cavity of the alignment portion 101 producing test probe 105 misalignment as shown in the bottom view of the device and plunger 200 in FIG. 1A.

In order to have good alignment between the contactor pins 105 and device contact pads 104 even under the 0.2 mm device body tolerance range (as an example), it is necessary to make sure that device is at the center of the plunger. This embodiment ensures that the device is at the center of the plunger before presenting the device to the contactor, regardless of where the device body dimension falls within the existing package tolerance. It also inhibits device movement if the device under test is smaller than nominal, and inhibits stuck devices if the device under test is larger than the nominal.

Figure 1A:
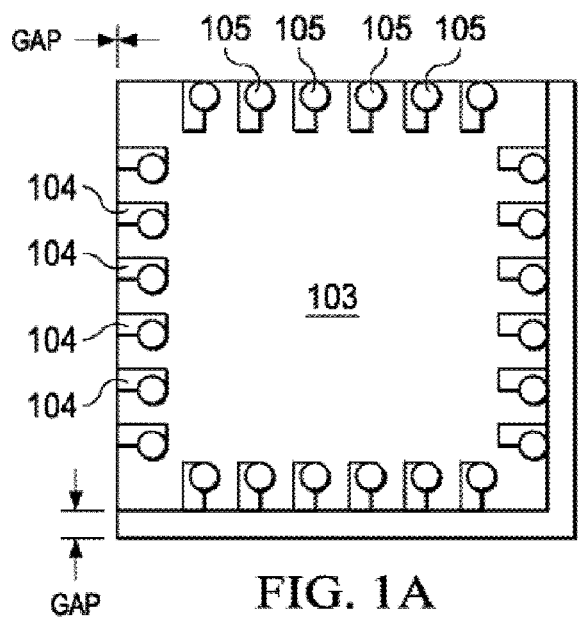
FIG. 1A is a bottom view of a surface mount device contained in a plunger, having a vertical wall alignment portion, detailing alignment gaps and test probe locations, according to one embodiment of this invention.
Figure 2A:
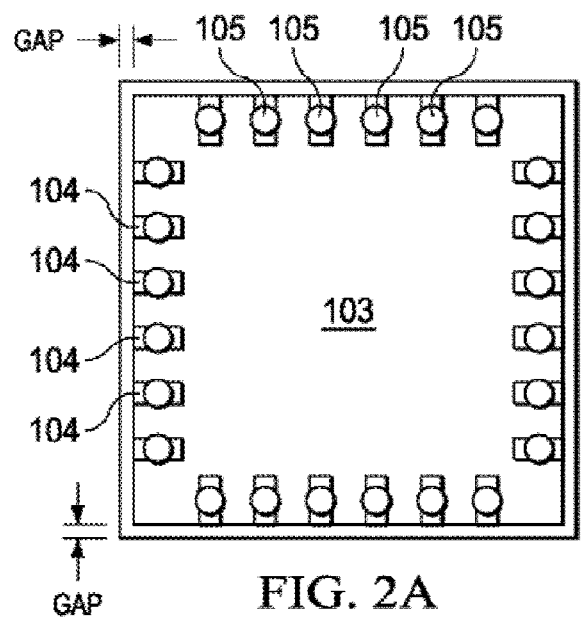
FIG. 2A is a bottom view of a surface mount device contained in a plunger, having a reverse funnel alignment portion, detailing alignment gaps and test probe locations, according to one embodiment of this invention.
Figure 3:
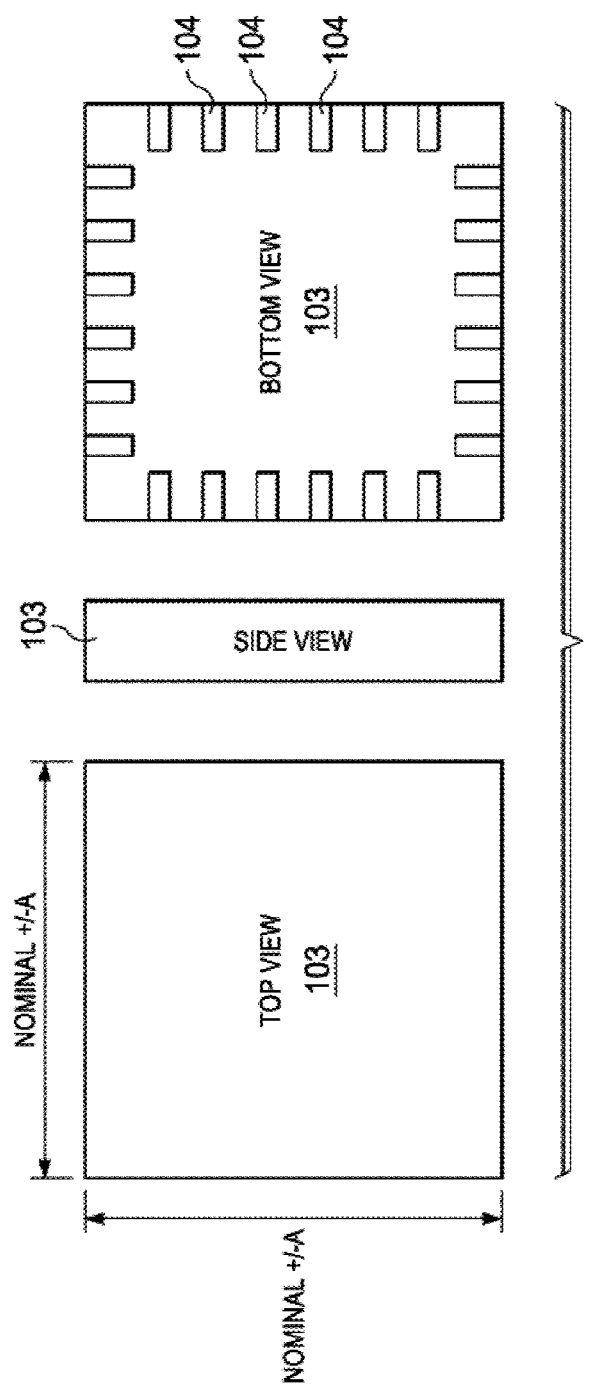
FIG. 3 is a front, back and side view of an exemplary surface mount device.

As can be seen by comparing FIGS. 1A and 2A, better device pad 104 to contactor pin 105 presentation can be obtained with the reverse funnel alignment portion, because the device is positioned at the center of the hardware, thus minimizing continuity problems.

Current practice in the industry is for the alignment portion to have a clearance against the top of the device package. In addition, the vacuum pad 401 in FIG. 4A touches the device first before the alignment portion. However, allowing the vacuum pad 401 to touch the device first restricts the device from self-aligning on the alignment portion and forcing the device to move along with the vacuum pad 401 movement and location. This reduces the optimum alignment capability offered by the funnel alignment portion 201 on the plunger as well as other existing vertical alignment portion wall 100 hardware. The solution is to move the device closer to the alignment portion until they touch one another. At worst case, where the device becomes thicker and the device and plunger overlap with each other, a spring is embedded in the plunger mechanism that will absorb any excess impact to prevent the device from breaking. Using the aforementioned method, the alignment portion positions the device first correctly within its walls before vacuum pad initiates the action of picking up the device.

In practice, the reverse funnel wall cavity 201, shown in FIG. 2, is configured such that the dimension A at the top of the funnel is less than or equal to (preferably less than) the minimum tolerance size of the device to be contacted, the dimension B at the bottom of the funnel is greater than or equal to (preferably greater than) the maximum size of the device to be contacted, and the dimension C is less than the maximum thickness of the device to be contacted but large enough to provided sufficient contact for alignment of the device with the plunger, thus allowing the device to protrude from the bottom of the plunger. To determine the tolerance of devices, sample devices can be measured and the tolerance range can be determined from the average +/−3 standard deviations of the samples. As an example, for a nominal 3×3 mm device with a ±0.1 tolerance and a 1 mm thickness, the dimensions would preferably be, A<2.90, B>3.10 and C=0.33 mm.

Aligning the device with the plunger before vacuum pick-up allows for better device alignment on the plunger as it ensures devices to be at the center of the plunger regardless if the device package dimension is at the minimum or maximum of the package tolerance.

FIG. 4 is a side view of an exemplary test head detailing the test head including the plunger 200, the device alignment portion 402 and associated hardware, according to one embodiment of this invention.

Figure 4A:
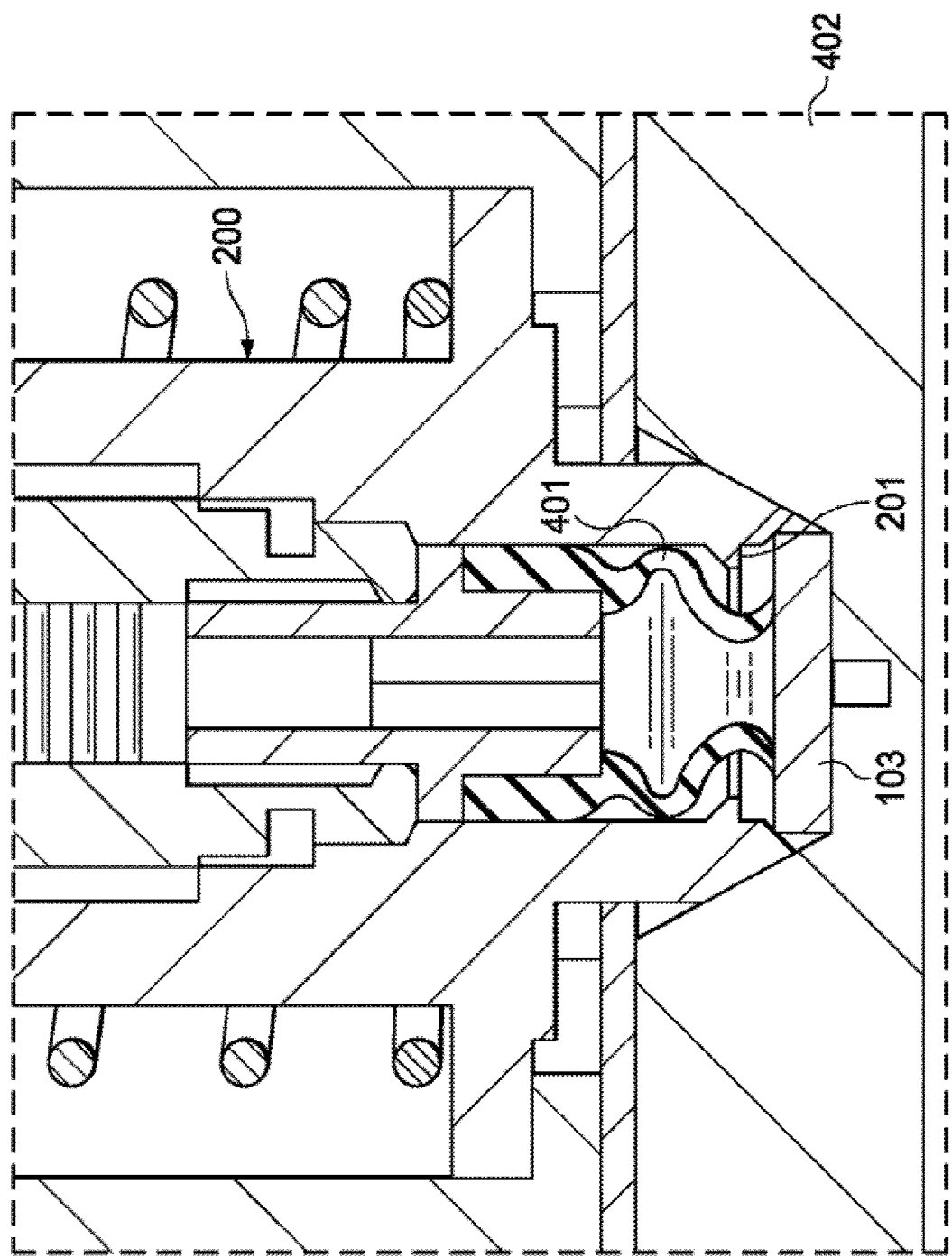
FIG. 4A is an enlarged view of the plunger and alignment portion shown in FIG. 4.

FIG. 4A is an enlarged view of the test head including the plunger 200, the alignment portion 402, the alignment portion 201, the vacuum pad 401 and the device 103 to be tested, according to one embodiment.

Figure 5A:
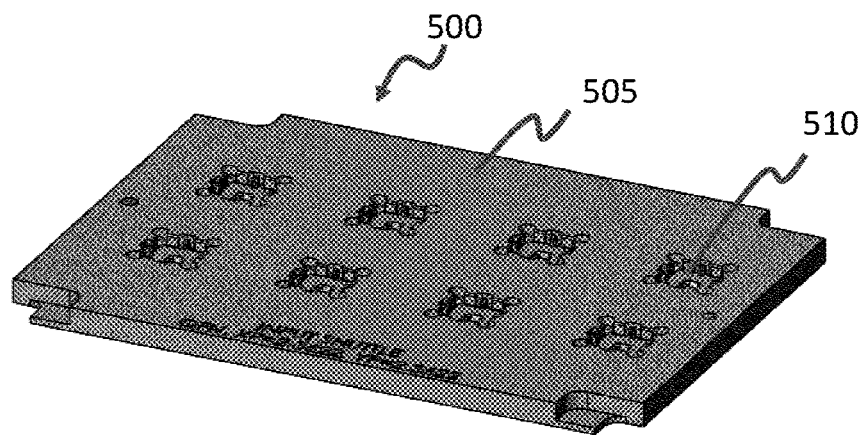
FIG. 5A is a top perspective view of an input shuttle, according to one embodiment of this invention.

Input Shuttle Having Tight Fit Nest Design and Floating Pocket with Funnel Alignment FIG. 5A is a top perspective view of an input shuttle 500, according to one embodiment of this invention. The input shuttle 500 carries devices under test to a location at which they can be picked up using a test head. The input shuttle 500 includes a shuttle plate 505, and a plurality of floating pockets 510 (in this example, eight floating pockets 510).

Figure 5B:
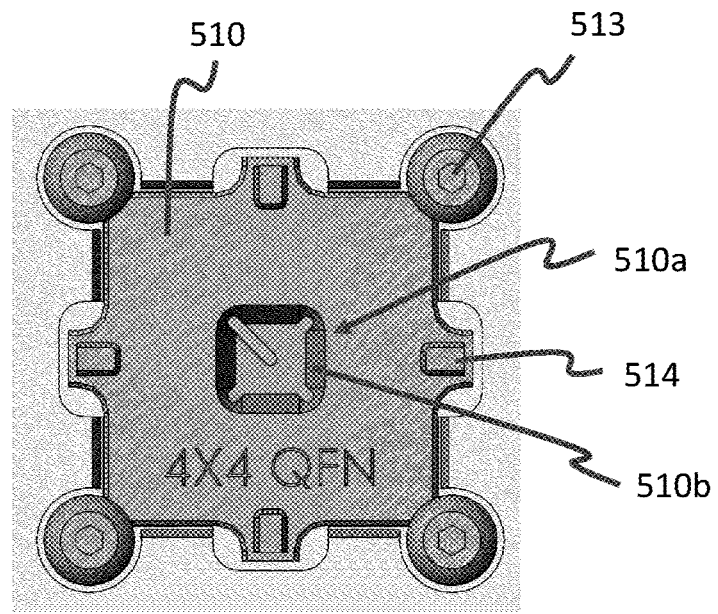
FIG. 5B is a top view of a floating pocket of the input shuttle shown in FIG. 5A.
Figure 5C:
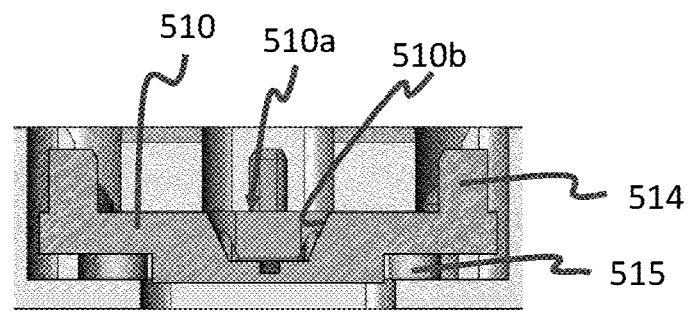
FIG. 5C is a side cross-sectional view of the floating pocket shown in FIG. 5B.
Figure 5D:
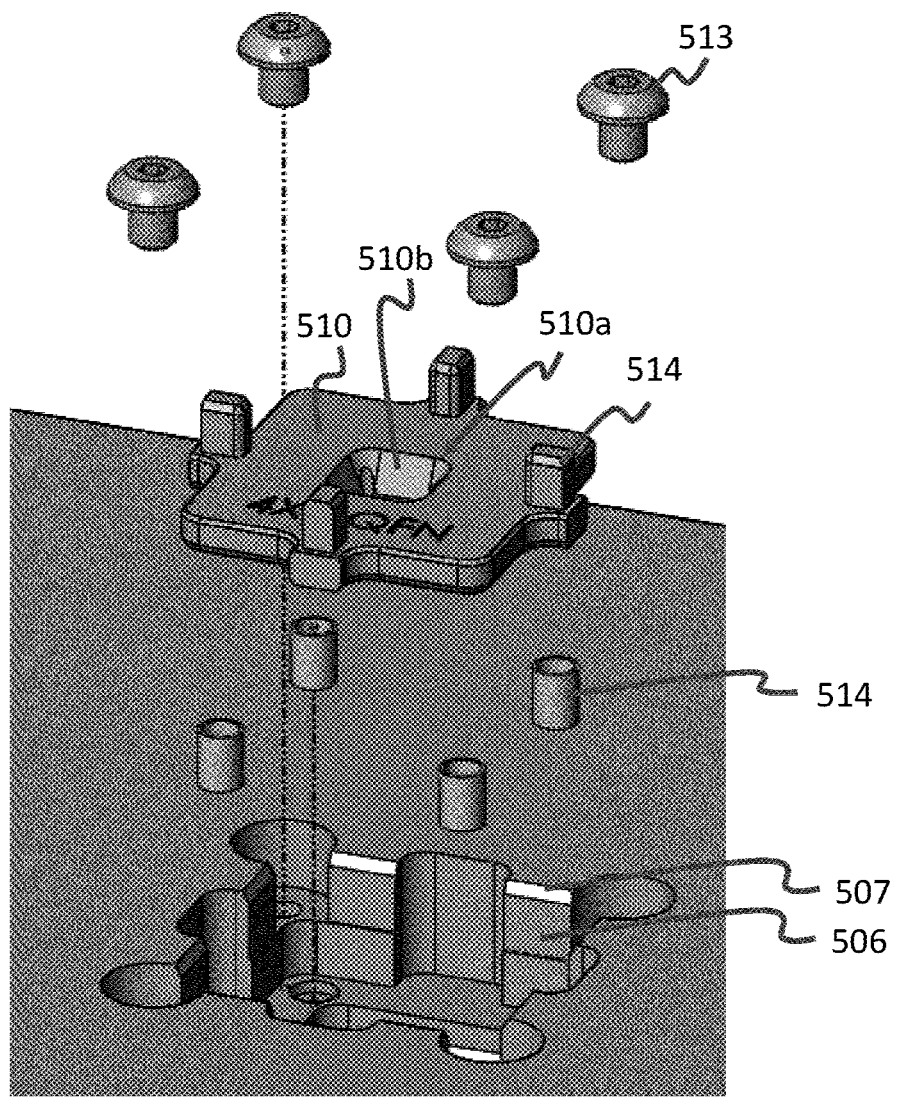
FIG. 5D is a perspective exploded view of the floating pocket shown in FIGS. 5B and 5C.

FIG. 5B is a top view of a floating pocket 510 of the input shuttle 500 shown in FIG. 5A. FIG. 5C is a side cross-sectional view of the floating pocket 510 shown in FIG. 5B. FIG. 5D is a perspective exploded view of the floating pocket 510 shown in FIGS. 5B and 5C. Each floating pocket 510 includes a device recess 510a. The recess 510 has sloped side walls 510b that are sloped inwardly towards a bottom of the recess 510. The floating pocket 510 is held to the shuttle plate 505 via four retainer screws 513. The floating pocket 510 includes four cross style alignment bosses 514 that keep the floating pocket 510 aligned in the shuttle plate 505. The floating pocket 510 rests on four return springs 515, such that the floating pocket 510 is able to move both horizontally and vertically within recesses 506 of the shuttle plate 505. Top edges of each recess 506 include sloped surface 507, configured to guide a nest body of a test head into the recesses, as discussed in more detail below.

Test Head Including Plunger and Separate Funnel Insert

Figure 6A:
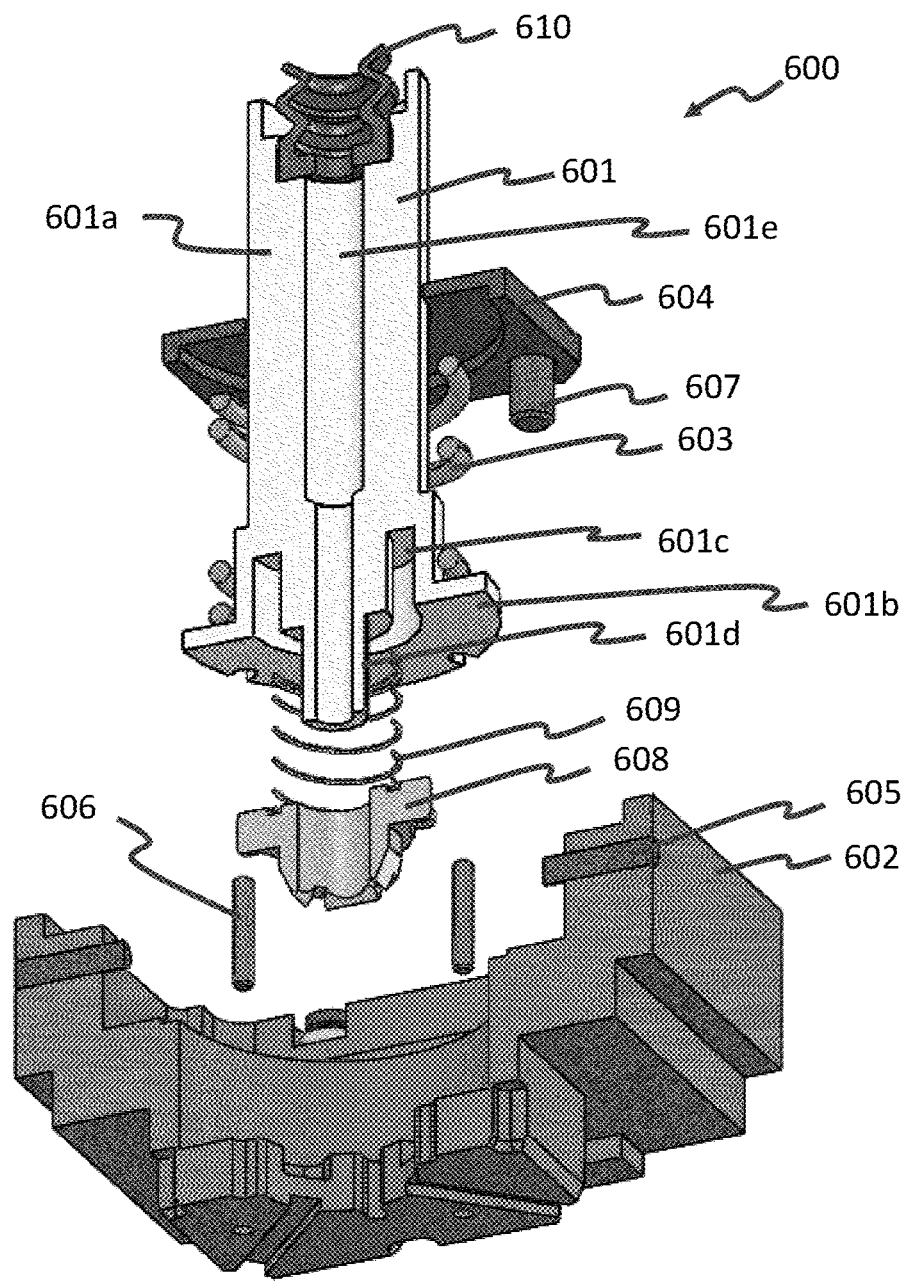
FIG. 6A is a perspective exploded view of a test head having a funnel insert, according to another embodiment of this invention.

FIG. 6A is a perspective exploded view of a test head 600 having a plunger 601 and a separate funnel insert 608, according to another embodiment of this invention. In this embodiment, rather than the plunger being integral with a funnel alignment portion, as in the embodiment of FIGS. 4 and 4A, the test head includes a separate funnel insert 608.

Figure 6B:
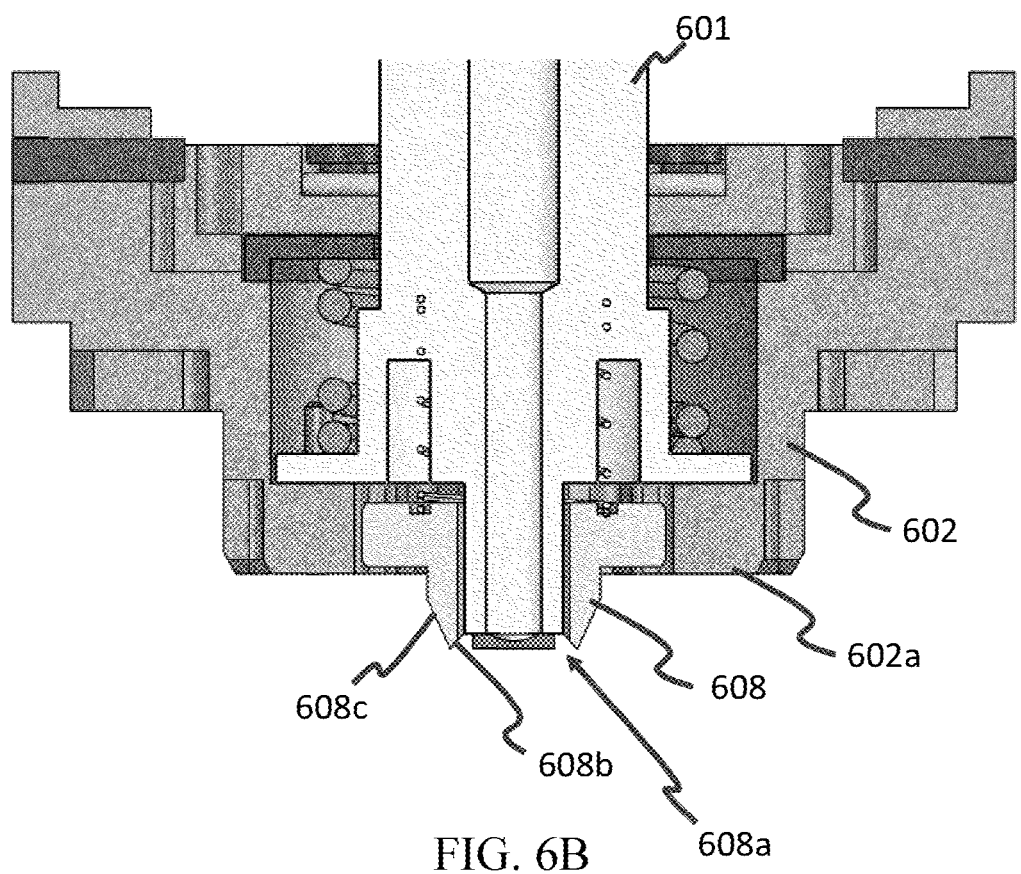
FIG. 6B is a side cross-sectional view of a portion of the test head shown in FIG. 6A.
Figure 6C:
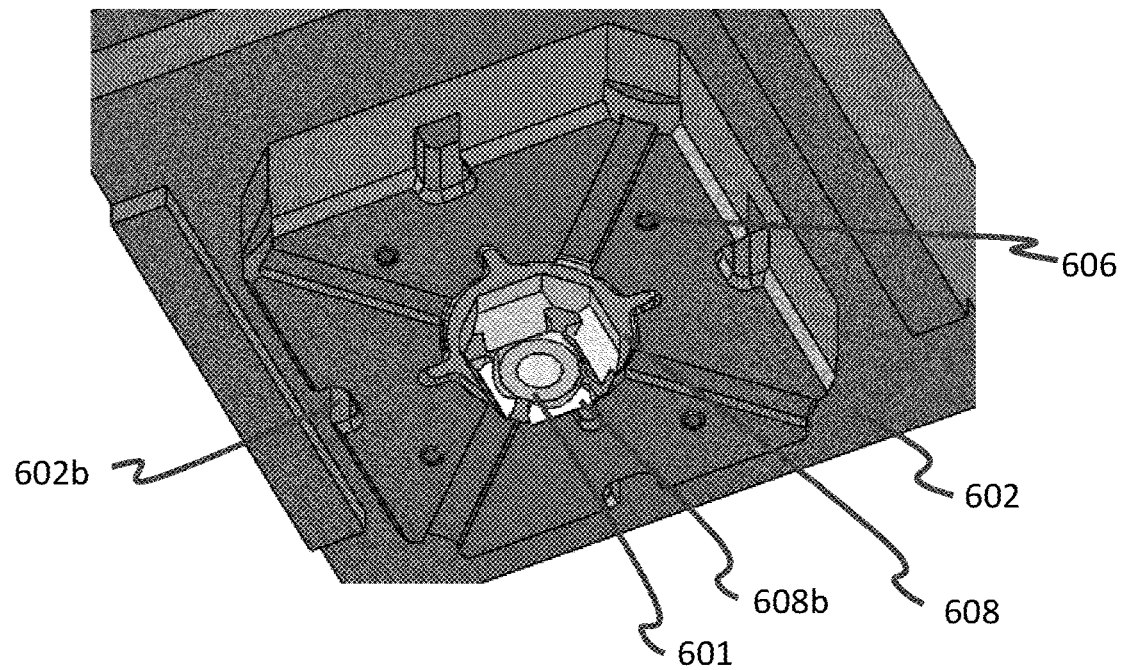
FIG. 6C is a bottom perspective view of a portion of the test head shown in FIG. 6A.
Figure 6D:
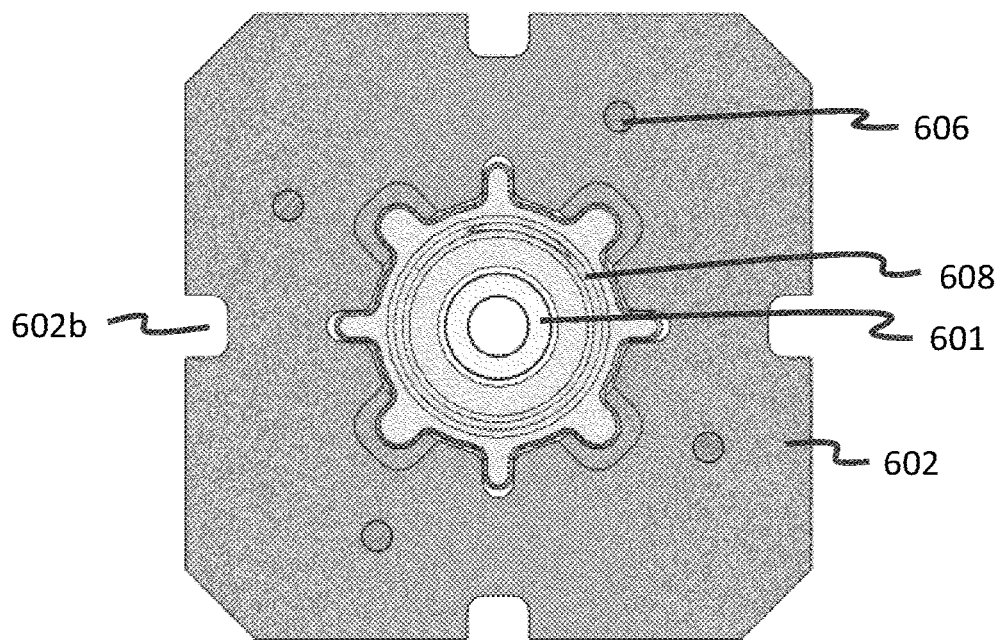
FIG. 6D is a bottom view of a portion of the test head shown in FIG. 6A.

FIG. 6B is a side cross-sectional view of a portion of the test head 600 shown in FIG. 6A. FIG. 6C is a bottom perspective view of a portion of the test head 600 shown in FIG. 6A. FIG. 6D is a bottom view of a portion of the test head 600 shown in FIG. 6A. The test head 600 includes the plunger 601 and a nest body 602. The plunger 601 includes an elongated portion 601a, and a plate portion 601b located at a distal side of the elongated portion 601a (the bottom side in FIG. 6A).

A spring retainer plate 604 is removably fastened to the nest body 602 using, for example, two screws 607 (only one screw 607 is shown in FIG. 6A). A plunger spring 603 is located between a top surface of the plate portion 601b and a bottom surface of the spring retainer plate, such that when the spring retainer plate 604 is fastened to the next body 602, the spring 603 is compressed between the plate portion 601b and the spring retainer plate 604. Alignment pins 606 align the plunger 601 to the nest body 602. In other embodiments, the plunger spring 603 can be replaced by a compliant piston. In yet other embodiments, the plunger spring 603 is omitted, and the plunger 601 is directly attached to the nest body 602.

The plunger 601 further includes an annular recess 601c and a projecting portion 601d, extending distally of the plate portion 601b. A channel 601e extends through the entirety of the plunger 601, including the elongated portion 601a and the projecting portion 601d.

The test head 600 further includes a funnel insert spring 609. A proximal side of the funnel insert spring 609 is disposed in the annular recess 601c of the plunger 601. A distal side of the funnel insert spring 609 is attached to the funnel insert 608. A spring constant of the funnel insert spring 609 is lower than a spring constant of the plunger spring 603.

As shown in FIG. 6B, clearance is provided between a top surface of the funnel insert 608 and a bottom surface of the plate portion 601b of the plunger 601. A bottom surface of the plate portion 601b rests against a top surface of an inner flange 602a of the nest body 602.

A channel 608a extends axially through the funnel insert 608 so as to communicate with the channel 601e of the plunger 601. The funnel insert 608 includes sloped inner walls 608b located at a distal side of the funnel insert 608. The sloped inner walls 608b slope outwardly in a distal direction of the funnel insert 608 (downward in FIG. 6B). In the embodiment shown in FIGS. 6A-6D, the funnel insert 608 includes four sloped inner walls 608b, each of which is flat and corresponds to one side of a rectangular device under test.

The funnel insert also includes sloped outer walls 608c that slope inwardly in the distal direction of the funnel insert 608. In the embodiment shown in FIGS. 6A-6D, the funnel insert 608 includes four sloped outer walls 608c, each of which is flat and corresponds to one side of the sloped side walls 510 of the floating pocket 510.

The funnel insert 608 is disposed in an opening in a flange 602a of the nest body. The projecting portion 601d extends into the channel 608a of the funnel insert 608. When the spring 609 is in an uncompressed state, a distal end of the funnel insert 608 extends past a distal end of the projecting portion 601d of the plunger 601, as shown in FIG. 6B.

A vacuum cup 610 (or "vacuum input port") communicates with the channel 601e of the plunger 601 and the channel 608a of the funnel insert 608, to provide suction to hold a device under test.

The nest body 602 includes grooves 602b configured to engage with the alignment bosses 514 of the floating pocket 510.

Latch pins 605 are disposed in the nest body 602. The latch pins 605 engage with a latch on a chuck of the test handler, to allow the nest body 602 to be attached to the chuck.

This embodiment provides several additional benefits over the embodiment shown in FIGS. 4 and 4A. For example, in the embodiment shown in FIGS. 4 and 4A, the entire socketing force is transferred onto the funnel surface and the top edges of the device under test. This can cause accelerated wear to the sloped inner walls of the funnel, and can potentially cause damage to the device under test. Additionally, the line contact between the funnel and the device under test limits thermal transfer from the plunger to the device under test during temperature testing.

In the device shown in FIGS. 6A-6D, on the other hand, the bottom surface of the projecting portion of the plunger is able to contact the top surface of the device under test. Thus, there is surface contact instead of line contact between the funnel and the device under test. This prevents the wear caused by line contact between the funnel and the device under test, and also helps to increase thermal transfer to the device under test during temperature testing.

Method of Using Test Head Including Plunger and Separate Funnel Insert

Use of the test head 600 will be described with reference to FIGS. 7A-7H.

Figure 7A:
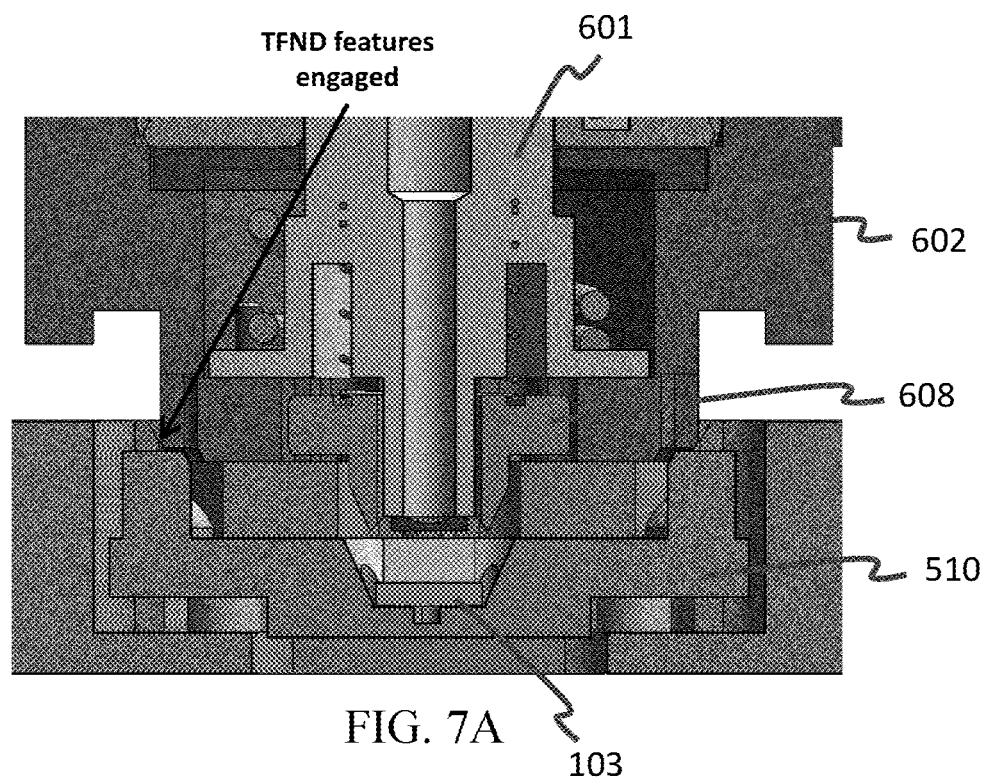
FIG. 7A depicts a step of aligning a nest body of a test head to a shuttle plate of an input shuttle, with sloped surfaces at top edges of a recess of the test plate engaged with grooves of the nest body to guide the nest body into the recess.

FIG. 7A depicts a step of aligning the nest body 602 of the test head 600 to the shuttle plate 505 of an input shuttle 500, with sloped surfaces 507 at top edges of the recess 506 of the test plate 505 engaged with the nest body 602 to guide the nest body 602 into the recess 506.

Figure 7B:
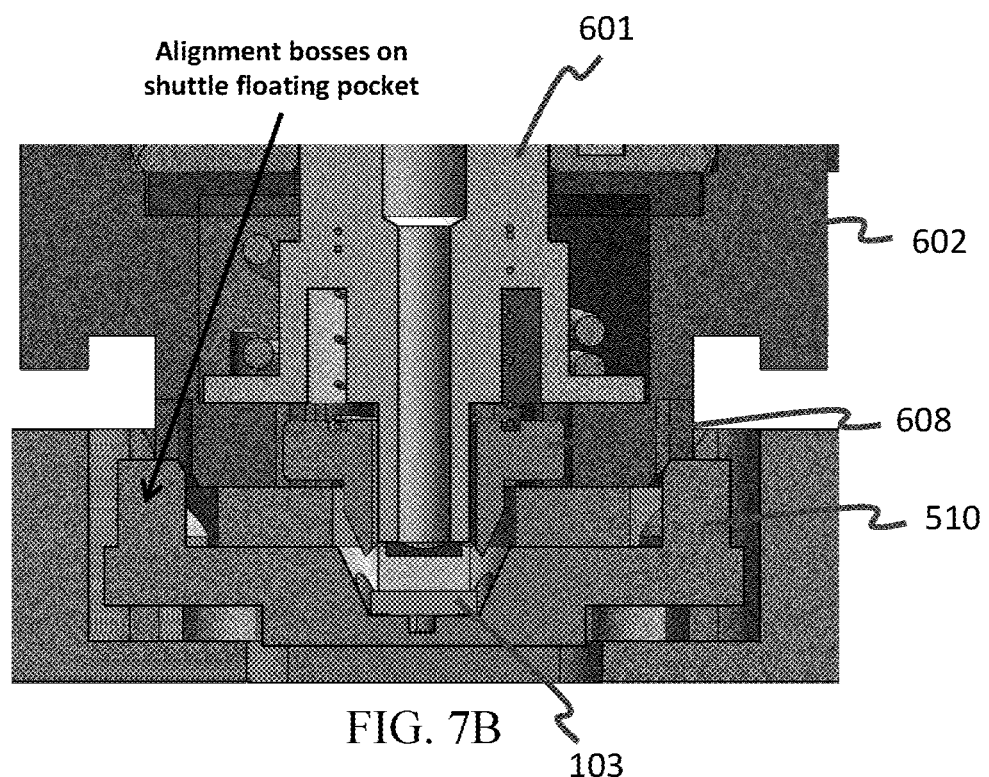
FIG. 7B depicts a step of aligning the nest body of the test head to a shuttle plate of the input shuttle, with alignment bosses of the floating pocket of the input shuttle engaged with the nest body, according to one embodiment of the invention.

FIG. 7B depicts a step of aligning the nest body 602 of the test head 600 to the shuttle plate 505 of the input shuttle 500, with alignment bosses 514 of the floating pocket 510 of the input shuttle 500 engaged with the grooves 602*b* of the nest body 602.

Figure 7C:
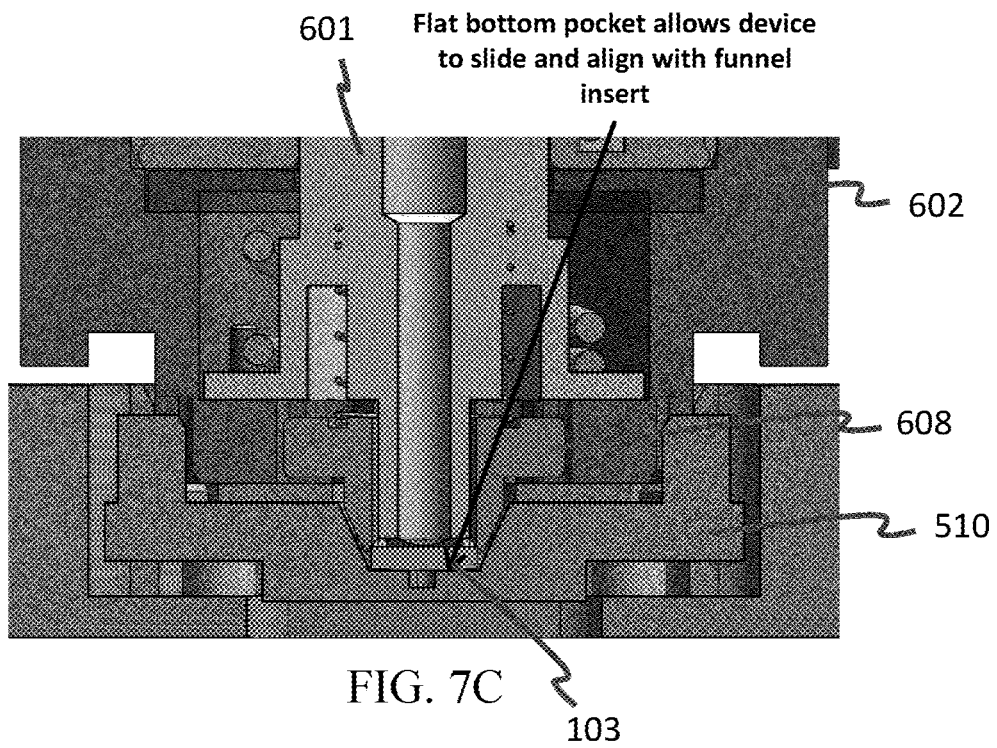
FIG. 7C depicts a step of contacting a funnel insert of the test head with a device under test such that the device is aligned by the funnel insert, according to one embodiment of the invention.

FIG. 7C depicts a step of contacting a funnel insert 608 of the test head 600 with a device under test 103 such that the device is aligned by the funnel insert 608. Specifically, the sloped inner surfaces 608*b* of the funnel insert 608 contact top edges of the device 103, causing the device to become centered in the funnel insert 608. Because the spring constant of the funnel insert spring 609 is smaller than that of the plunger spring 603, the funnel insert 608 moves upwards until the projecting portion 601*d* of the plunger 601 contacts the device 103.

Figure 7D:
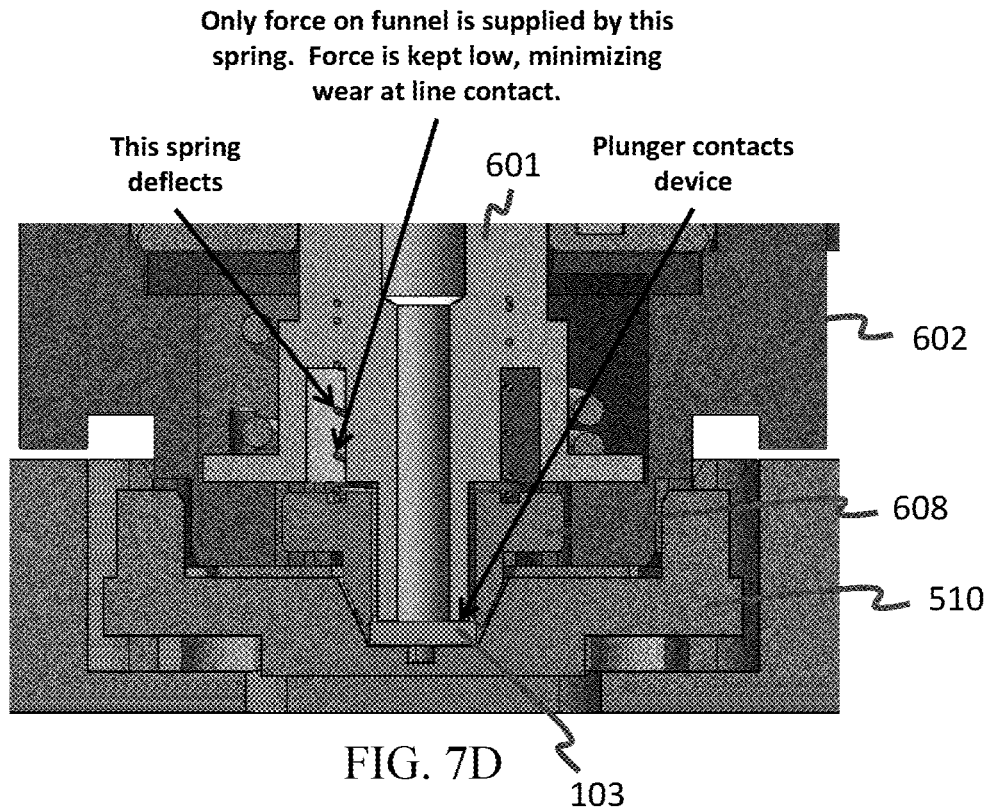
FIG. 7D depicts a step of contacting a plunger of the test head with the device under test, according to one embodiment of the invention.

FIG. 7D depicts a step of contacting the projecting portion 601*d* of the plunger 601 of the test head 600 with the device under test 103. Due to this contact, the funnel insert 608 will no longer move upward relative to the plunger 601.

Figure 7E:
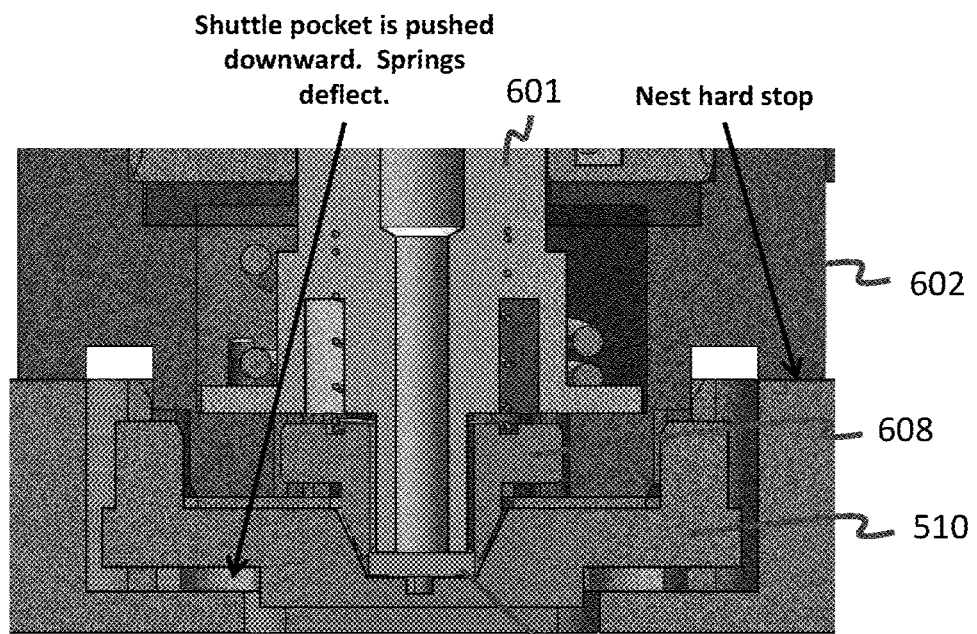
FIG. 7E depicts a step of pushing the device and floating pocket downward with the plunger such that springs of the input shuttle deflect, according to one embodiment of the invention.

FIG. 7E depicts a step of pushing the device 103 and floating pocket 510 downward with the plunger 601 such that springs 514 of the input shuttle 500 deflect. The springs thus compensate for over pressing of the plunger 601, so that the device 103 is not subjected to excessive force by the plunger 601.

Figure 7F:
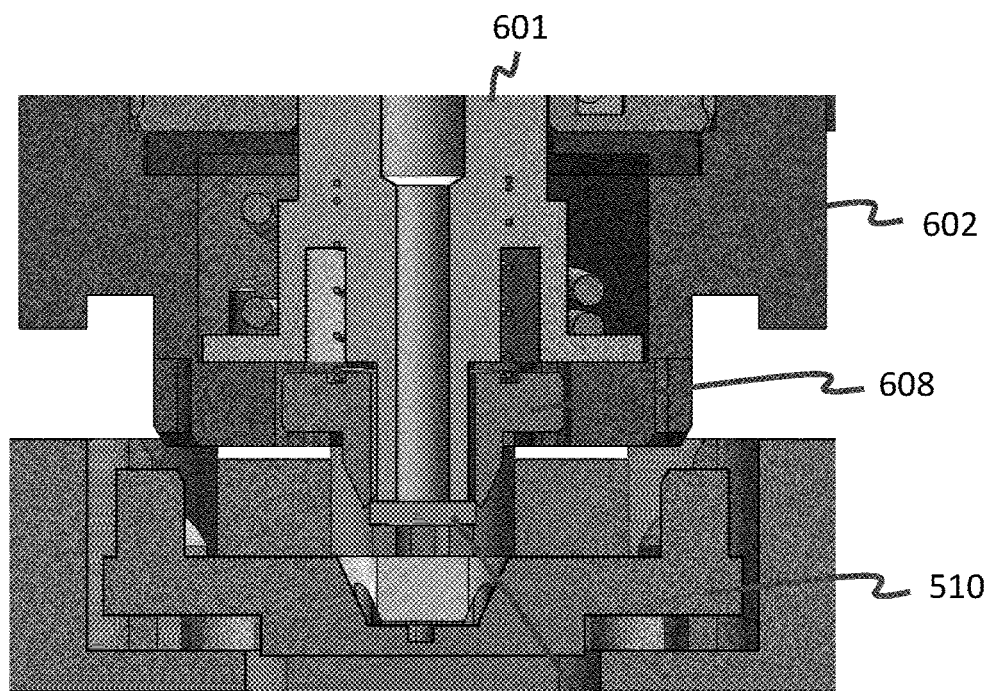
FIG. 7F depicts a step of picking the device under test from the input shuttle with the test head, according to one embodiment of the invention.

FIG. 7F depicts a step of picking the device under test 103 from the input shuttle 500 with the test head 600, via vacuum through the channels 601*e*, 608*a* of the plunger 601 and funnel insert 608.

Figure 7G:
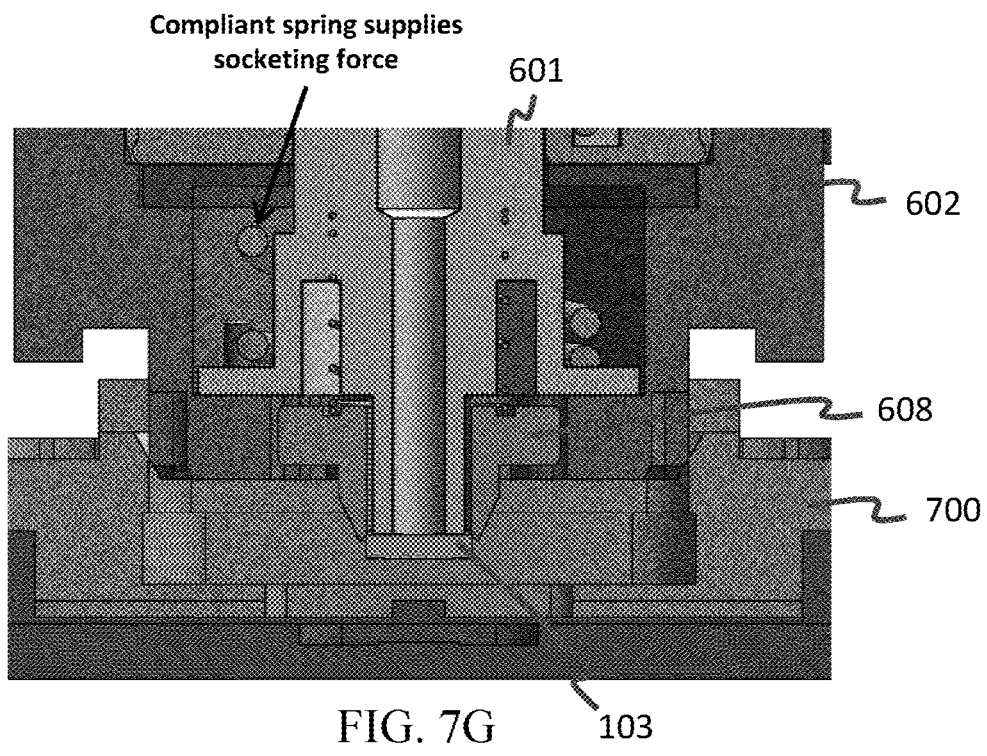
FIG. 7G depicts a step of presenting the nest body of the test head to a test socket, according to one embodiment of the invention.

FIG. 7G depicts a step of presenting the nest body 602 of the test head 600 to a test socket 700.

Figure 7H:
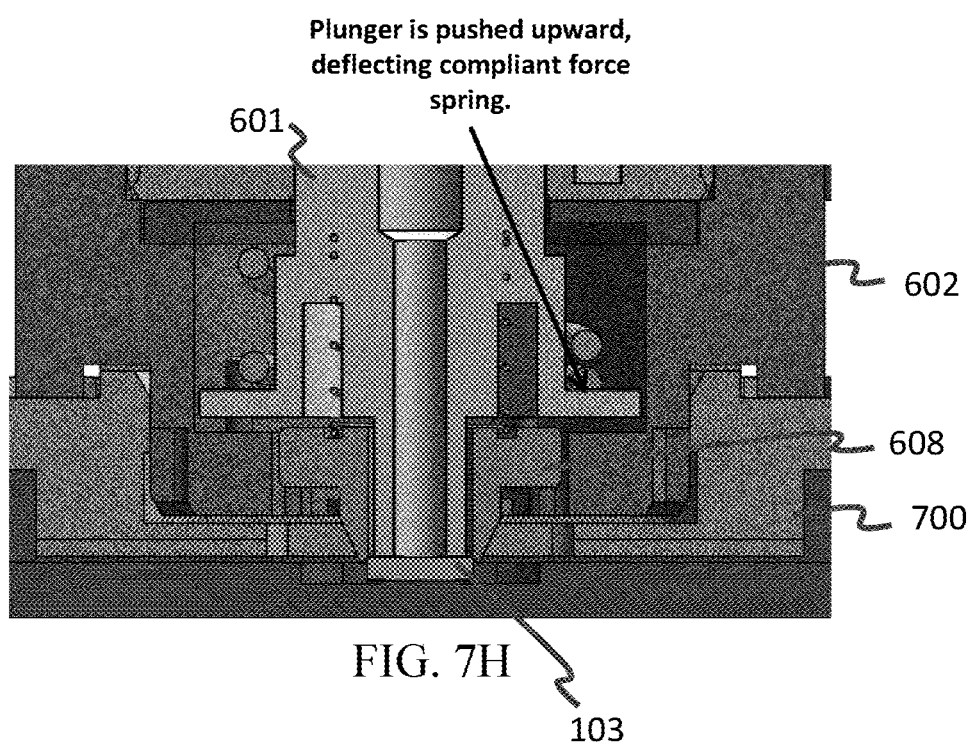
FIG. 7H depicts a step of pushing the device under test into the test socket, such that the plunger of the test head is pushed upward, according to one embodiment of the invention.

FIG. 7H depicts a step of pushing the device under test 103 into the test socket 700, such that the plunger 601 of the test head 600 is pushed upward relative to the nest body 602. Thus, the force to press the device 103 into the test socket 700 is supplied by the plunger spring 603 via the projecting portion of the plunger 601.

Figure 8:
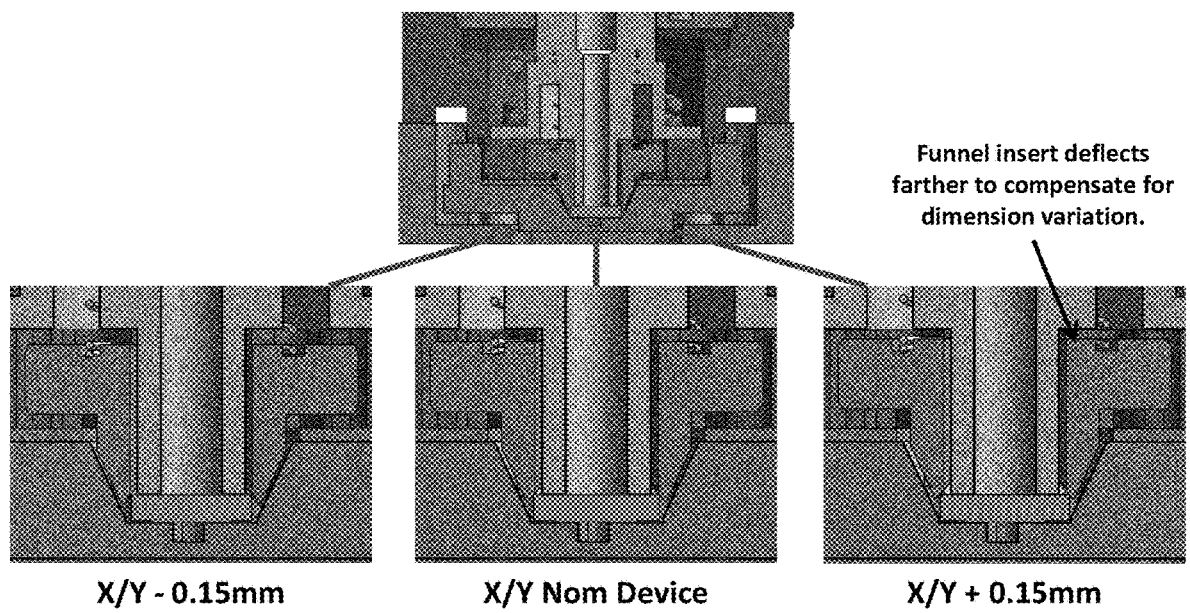
FIG. 8 depicts the capability of a test head according to an embodiment of the invention of picking up devices having varying heights.

FIG. 8 depicts the capability of a test head according to an embodiment of the invention of picking up devices having varying heights (in this case, widths varying from nominal by ±0.15 mm).

Figure 9:
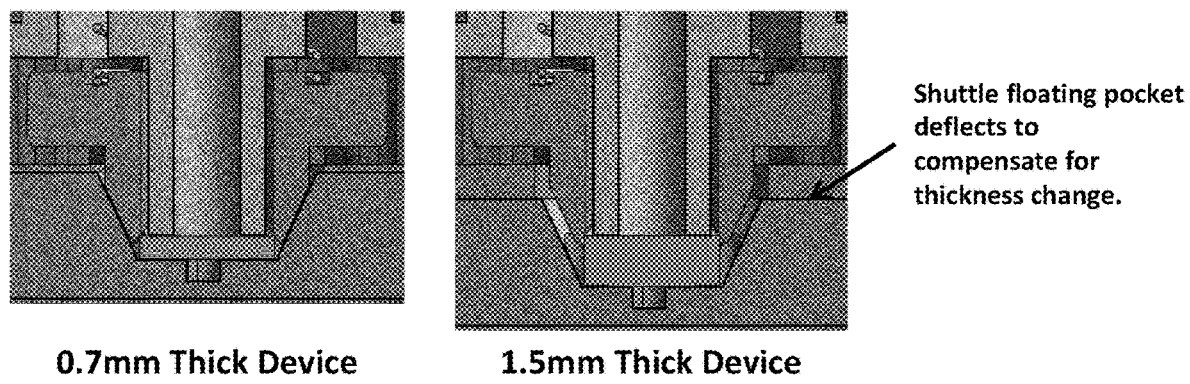
FIG. 9 depicts the capability of a test head according to an embodiment of the invention of picking up devices having varying thicknesses.

FIG. 9 depicts the capability of a test head according to an embodiment of the invention of picking up devices having varying thicknesses (in this case, thicknesses varying from 0.7 to 1.5 mm).

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A test head for a semiconductor device handler, the test head comprising:
   a plunger; and
   a funnel insert movably attached to and vertically movable relative to the plunger via a funnel insert spring, the funnel insert having a channel extending axially therethrough, and the funnel insert including a plurality of sloped inner walls, wherein the plurality of sloped inner walls are sloped outwardly in a distal direction of the funnel insert toward a distal end of the funnel insert and are configured to contact upper edges of a semiconductor device to center the semiconductor device in the funnel insert,
   wherein the plunger includes a projecting portion that extends through the channel of the funnel insert, and
   wherein, when the spring is in an uncompressed state, the distal end of the funnel insert extends past a distal end of the projecting portion of the plunger.

2. The test head of claim 1, further comprising:
   a nest body having an inner flange at a distal end thereof;
   a spring retainer plate attached to the nest body; and
   a plunger spring,
   wherein the plunger further includes a plate portion,
   wherein the plunger spring is disposed between a lower surface of the spring retainer plate and an upper surface of the plate portion of the plunger, such that the plunger spring presses the plunger against an upper surface of the inner flange of the nest body, and
   wherein a spring constant of the funnel insert spring is lower than a spring constant of the plunger spring.

3. The test head of claim 1, wherein the plunger further includes an annular groove in which the funnel insert spring is disposed.

4. The test head of claim 1,
   wherein the plunger has a channel extending axially therethrough, the channel of the plunger communicating with the channel of the funnel insert, and
   the test head further comprises a vacuum input port disposed at a proximal end of the plunger, the vacuum input port being configured to supply a vacuum to the channels of the plunger and funnel insert.

5. The test head of claim 1, wherein the funnel insert further includes a plurality of sloped outer walls that are sloped inwardly in a distal direction of the funnel insert.

6. A test handler including:
   the test head of claim 5, and
   an input shuttle comprising:
      a recess, and
      a floating pocket disposed in the recess and comprising a device recess configured to hold the semiconductor device,
      wherein the device recess is defined by sloped side walls that are sloped inwardly towards a bottom of the recess, the sloped side walls of the device recess corresponding to the sloped outer walls of the funnel insert.

7. A test head for a semiconductor device handler, the test head comprising:
   a plunger;
   a funnel insert movably attached to the plunger via a funnel insert spring, the funnel insert having a channel extending axially therethrough, and the funnel insert including a plurality of sloped inner walls that are sloped outwardly in a distal direction of the funnel insert and configured to contact upper edges of a semiconductor device to center the semiconductor device in the funnel insert;
   a nest body having an inner flange at a distal end thereof;
   a spring retainer plate attached to the nest body; and
   a plunger spring,
   wherein the plunger includes
      a projecting portion that extends through the channel of the funnel insert,
      a plate portion, and an elongated portion extending proximally from the plate portion and extending through an opening in the spring retainer plate, and wherein, when the funnel insert spring is in an uncompressed state, a distal end of the funnel insert extends past a distal end of the projecting portion of the plunger, wherein the plunger spring is disposed between a lower surface of the spring retainer plate and an upper surface of the plate portion of the plunger, such that the plunger spring presses the plunger against an upper surface of the inner flange of the nest body, and wherein a spring constant of the funnel insert spring is lower than a spring constant of the plunger spring.

* * * * *